United States Patent
Hotine

(10) Patent No.: US 6,275,686 B1
(45) Date of Patent: Aug. 14, 2001

(54) DIFFERENTIAL PHASE SHIFT AMPLIFIER OF ELECTRICAL OR PHYSICAL QUANTITIES

(75) Inventor: William Hotine, Oceano, CA (US)

(73) Assignee: Imogene Healy, Riverside, CA (US)

(*) Notice: Subject to any disclaimer, the term of this patent is extended or adjusted under 35 U.S.C. 154(b) by 0 days.

(21) Appl. No.: 09/228,509

(22) Filed: Jan. 11, 1999

Related U.S. Application Data

(60) Provisional application No. 60/074,343, filed on Feb. 9, 1998.

(51) Int. Cl.$^7$ .................................................. H04Q 7/32
(52) U.S. Cl. ........................... 455/253.2; 455/76; 455/84; 455/81; 455/119; 455/127; 455/341; 330/252; 327/355; 327/356; 327/357
(58) Field of Search ..................... 455/253.2, 76, 455/84, 81, 91, 119, 127, 341, 323, 326, 333, 313, 314, 63, 67.3, 43, 110, 112, 113, 118; 330/252; 327/355, 356, 357, 358, 359

(56) References Cited

U.S. PATENT DOCUMENTS

| | | | | |
|---|---|---|---|---|
| 4,156,196 | * | 5/1979 | Someno et al. ...................... | 455/76 |
| 4,270,206 | * | 5/1981 | Hughes .................................. | 455/84 |
| 5,722,053 | * | 2/1998 | Kornfeld et al. ..................... | 455/81 |
| 5,896,562 | * | 4/1999 | Heinonen ............................. | 455/76 |

\* cited by examiner

*Primary Examiner*—William Trost
*Assistant Examiner*—Keith Ferguson
(74) *Attorney, Agent, or Firm*—Daniel C. McKown

(57) ABSTRACT

An amplifier system for electrical or physical quantities such as voltage or sound converts the quantity in a transducer to a differential phase shift of a high carrier frequency which is an analog equivalent of the quantity and multiplies the differential phase shift by conversion to a low frequency and frequency doubling back to the carrier frequency in successive stages by means of digital logic circuits.

6 Claims, 4 Drawing Sheets

US 6,275,686 B1

DIFFERENTIAL PHASE SHIFT AMPLIFIER OF ELECTRICAL OR PHYSICAL QUANTITIES

REFERENCE TO RELATED APPLICATION

This application claims the benefit of U.S. Provisional Application No. 60/074,343 filed Feb. 9, 1998.

BACKGROUND OF THE INVENTION

Previous voltage amplifier systems have been subject to the masking effect of input circuit noise which has effectively limited the sensitivity threshold. A further previous problem has been the stable detection and amplification of very small static or dynamic physical or electrical quantities. Input semiconductor noise is generally present and amplification of small voltages has resulted in equal amplification of the masking semi-conductor noise in previous systems. Also, in previous systems, physical quantities are converted to voltages in order to amplify them and thus are also subject to the noise limitation. A better amplification system would not use voltage as the amplification medium.

SUMMARY OF THE INVENTION

The present novel amplification system amplifies a quantity that noise cannot duplicate or mask. Recurring phase of a carrier frequency is such a quantity. The new amplifier system to be described uses a novel input quantity to differential phase angle transducer with an associated frequency down conversion and frequency doubling differential phase shift amplifier chain with noise rejection and unconditional stability. Due to the cancellation of common mode effects in this differential arrangement, noise cannot affect the system or appear at the differential output. This novel amplifier system has unconditional stability and practically infinite gain.

OBJECTS OF THE INVENTION

The object of the invention is to provide an amplification system which is capable of practically infinite gain with unconditional stability and freedom from noise, able to amplify D.C. and A.C. voltages and all physical quantities by use of novel differential transducers converting these voltages and quantities to a differential phase shift of an A.C. carrier, and then amplifying this phase shift by down conversion and frequency multiplication until it is a frequency shift which can be multiplied and converted to an analog value. Although differential amplifier advantages and principles, together with phase multiplication have been known in the previous art, this new system combines these principles in a novel manner to overcome noise and stability problems of the previous art and furnish great amplification.

DESCRIPTION OF THE PREFERRED EMBODIMENT

Figure 1:
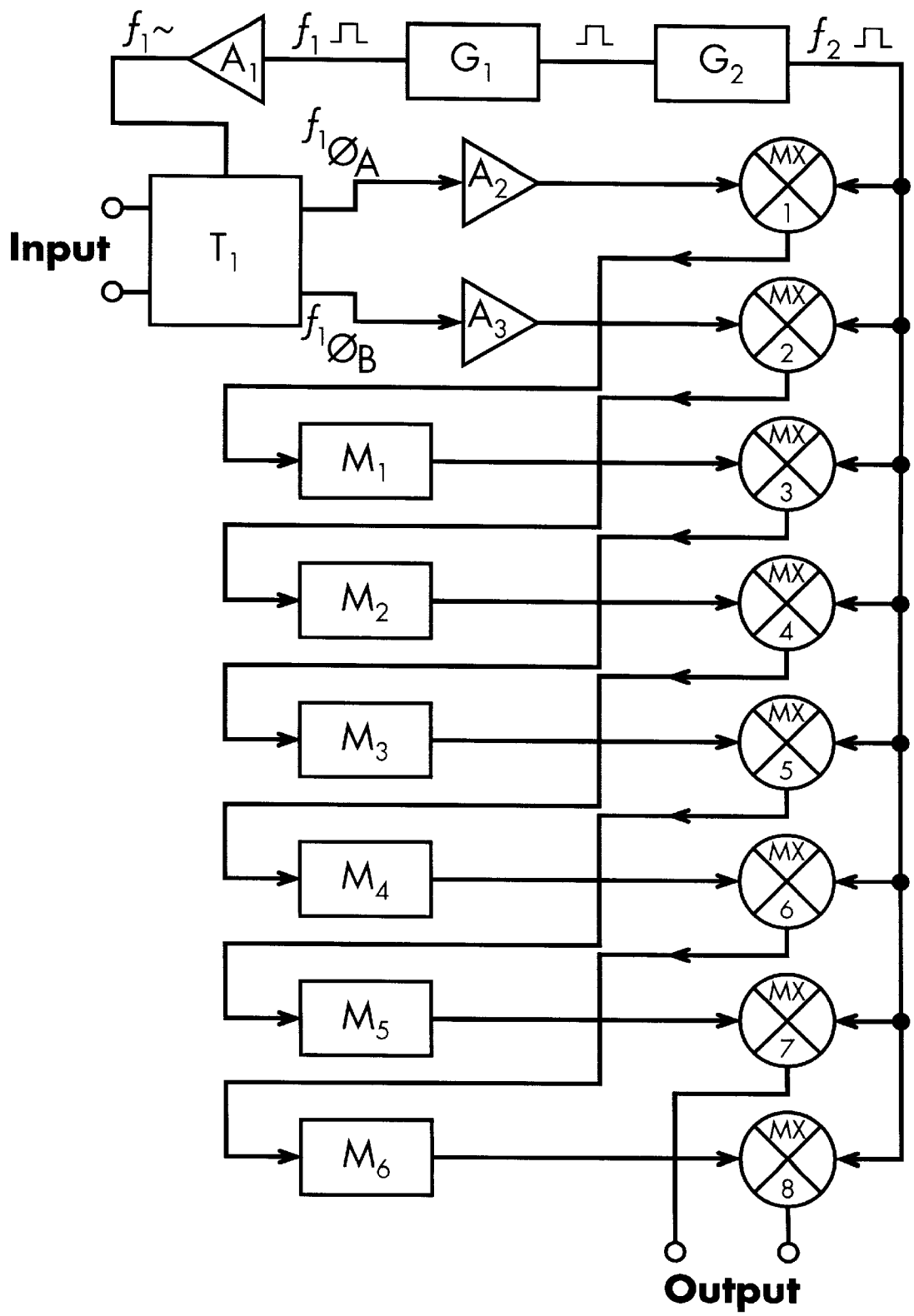
FIG. 1 is a block diagram of the invention.

This new system is directed to overcoming noise and stability problems of the previous art by employing the differential phase shift amplification principle. Although differential amplifier advantages and principles, together with phase multiplication have been well known in the previous art, the present system combines the advantages of these principles in a novel amplifier system made practical by use of digital logic integrated circuit components.

A stable high frequency alternating current sine wave carrier is applied to two identical phase shift circuits to detect and produce an equivalent analog of a physical or electrical quantity. The input quantity to be measured is applied to the differential transducer of the system, which converts the amplitude of the input quantity to a differential phase angle of two differential transducer outputs of the high frequency sine wave alternating current carrier. These two differential phase angle outputs are then converted to a low frequency and multiplied by frequency doubling to the carrier frequency as in frequency modulation transmitter circuits. The system is equally applicable to detection and amplification of either static or dynamic physical quantities by use of appropriate differential transducers, or to the detection and amplification of A.C. or D.C. voltages.

The resistance and reactance present in an alternating current circuit produces a phase shift of the current in relation to the voltage. The phase angle of the current is given by tan-1X/R where X is the reactance of the circuit and may be either capacitive or inductive, and R the resistance of the circuit. A change in either X or R or both will change the differential phase angle of two identical phase shift circuits supplied by a common high frequency sine wave alternating current carrier.

Due to the cancellation of common mode effects in this differential arrangement, circuit noise cannot affect the differential phase angle output. Random noise on the input quantity also has little effect on the average differential phase angle output of the differential transducer. Further, by using a multiplication of phase angle as the amplifying medium, noise cannot enter into the amplification process. Multiplication circuits may be employed throughout the system so that it can be easily extended to great phase differential and frequency differential multiplication with great amplification of the input quantity. The present system is therefore capable of detection and amplification of ultra-small quantities which might be masked by input circuit noise when using previous detection and amplification systems. A further advantage of the present system is its unconditional stability at any desired value of amplification, as the phases throughout the system always differ, thus preventing feedback.

In one aspect of the system, for example, it is used for amplification of small D.C. voltages. A differential transducer circuit for this purpose uses two depletion type MOS field effect transistors in a circuit which employs the source to drain resistances as differentially changing R in two RC phase shift circuits supplied by a one volt sine wave carrier frequency. At this source to drain voltage the MOSFETS act as resistors. The D.C. input voltage is applied to the gates of the transistors in a differential circuit in which the source to drain resistance of the transistors which were equal with zero voltage gate input are changed differentially in the two phase shift circuits which then produce two differential phase angle carrier outputs. The two transducer sine wave carrier frequency outputs are amplified to square waves and are heterodyned in two digital mixers to a low frequency which is $\frac{1}{32}$ of the carrier frequency, by a high beat frequency square wave equal to the carrier frequency plus $\frac{1}{32}$ of the carrier frequency, while preserving the phase differential. The two low frequencies are applied to the inputs of two identical frequency doubling circuit chains which multiply by 32 the two low frequency inputs differing differentially in their phase angle to the original high carrier frequency, thus equally multiplying the differential phase angle by 32. These two multiplied high frequency outputs at the carrier frequency are applied to two mixers and again are heterodyned by the same high beat frequency back down to two low frequencies to be again multiplied. This process of multiplication and heterodyning to low frequency is continued, resulting in a multiplication of the differential phase angle in the two multiplier chains equal to the frequency multiplication. Continuation of this process ultimately changes the differential phase angle to a differential frequency between the two multiplier-mixer chains. This differential frequency may be multiplied or mixed. Mixing of the two differential frequency outputs of the chains gives an output frequency difference which can be also multiplied and is an amplified analog of the D.C. input voltage. This output frequency may be further processed by additional circuits to give any desired electrical output such as a D.C. or A.C. voltage. By making the output of the high beat frequency generator a square wave at the logic level and having the outputs of the frequency multipliers square waves at the logic level, integrated circuit digital mixers may be used. Also, inverse feed back circuits may be used to automatically balance the transducer.

In a second aspect of the amplifier system it is used for amplification of small physical quantities. Differential transducers for this purpose use the input quantity to effect a differential change in either capacitance, inductance or resistance in a physical structure embodying two phase shift circuits fed by a common high frequency carrier. The two differential phase angle outputs of the transducer are processed by the same circuitry previously described.

For example, differentially variable capacitance, inductance or resistance may be employed in a suitable physical structure to detect and measure amplitudes of force, mass, movement, light, vibration, pressure, position, or gravitational or magnetic fields. Differential changes in either capacitive or inductive reactance, resistance, or combinations of these may be employed in the novel differential phase angle transducer of the present invention, to give a differential phase angle output for an input of any physical quantity, which is then amplified by the process described previously. This new type of transducer, in contrast to past types, does not convert the input quantity to a voltage.

These transducers may take mechanical, electrical, magnetic, gaseous or liquid form, depending on the input quantity to be measured. The frequency multipliers and mixers may be of well-known conventional design.

The transducer-amplifier system as described amplifies static input quantities With the summed output frequency also static. If the input quantity is dynamic or changing with time, the output frequency will be also dynamic and similarly changing with time, with the changes appearing as frequency modulation of the output frequency. This fact places a limitation on the high frequency response to time varying signals.

A block diagram of a prototype system is shown in FIG. 1. In FIG. 1, $G_1$ is a carrier frequency generator at a frequency of 2 MHz, the square wave output of which is termed frequency $f_1$, $G_2$ is a high beat frequency generator receiving $f_1$ and dividing by 32 to 0.0625 MHz which is mixed with $f_1$ to provide an output frequency of 2.0625 MHz, termed the high beat frequency $f_2$. The frequency $f_2$ has a square wave form. Amplifier $A_1$, is a signal conditioner receiving frequency $f_1$ in a square wave form from generator $G_1$ and has a sine wave output of one volt at low impedance which is applied to transducer $T_1$, in which the input quantity acts to produce two outputs of $f_1$ which are caused to differ differentially in their phase angle by the input quantity. The design of transducer $T_1$ depends on the nature of the input quantity. It is a differential phase shift circuit for electrical quantities. For other physical quantities, it is a mechanical arrangement accepting an input of a physical quantity, which converts the amplitude of the input quantity into a differential phase shift of $f_1$ in its two outputs. One output of $T_1$ is termed phase A and the other phase B, of frequency $f_1$.

Phases A and B are applied to amplifiers $A_1$ and $A_2$ which amplify them to square waves. These square waves at 2.0 MHz are applied to the inputs of digital mixers $MX_1$ and $MX_2$ together with the square wave output of $G_2$ at frequency $f_2$, which is 2.0625 MHz. The mixers are standard integrated circuits. The difference frequency output of mixers $MX_1$ and $MX_2$ is 0.0625 MHz and is fed to the inputs of frequency multipliers $M_1$ and $M_2$ which are two chains of 5 frequency doublers. Multipliers $M_1$ and $M_2$ multiply the input frequencies of 0.0625 MHz by 32 to 2.0 MHz. The phase angle of $f_1$ is thus multiplied by 32 in each multiplier chain of doublers. The differential phase angle is therefore multiplied by 64. The square wave multiplier outputs of $M_1$ and $M_2$ at 2.0 MHz are applied to digital mixers $MX_3$ and $MX_4$ which are also receiving the output of 2.0625 MHz from $G_2$. The beat frequency outputs of mixers $MX_3$ and $MX_4$ is 0.0625 MHz and is applied to the inputs of multipliers $M_3$ and $M_4$. The outputs of multipliers $M_3$ and $M_4$ are again 2.0 MHz and are applied to mixers $MX_5$ and $MX_6$. The differential phase angles of phase A and phase B of frequency $f_1$ have been again multiplied by 32. This process of phase multiplication and beating back to low frequency can be continued to get further multiplications of the phase angle differential.

FIG. 1 shows multiplication and down conversion of $f_1$. Each stage of this process multiplies the frequency of phases A and B by 32 and thus multiplies the phase shift of each signal by 32. In a differential D.C. voltage amplifier, one side's polarity is opposite to the other side. In a differential phase shift circuit, one side's phase shift is opposite in direction to the other side. The total phase shift is therefore twice the frequency multiplication factor of 32 used her, or 64. The total phase shift amplification in FIG. 1 is 3 stages of multiplication or $64^3$, or 262,144. This is approximately 120 dB. Depending on the amplitude of the input quantity, phase may become frequency in this multiplication. The frequency difference may be subtracted to get a single frequency value and this can be further multiplied, or demodulated to obtain an A.C. output frequency. It also can be converted to a D.C. voltage if desired.

There are many important applications for this amplifier system, particularly in the detection and amplification of physical quantities. Gravitational fields have been relatively unexplored up to the present time. The gravitational transducer of FIG. 3 is designed for this system of amplification. Sound is another application. A transducer design for detection of sound is shown in FIG. 2.

Figure 2:
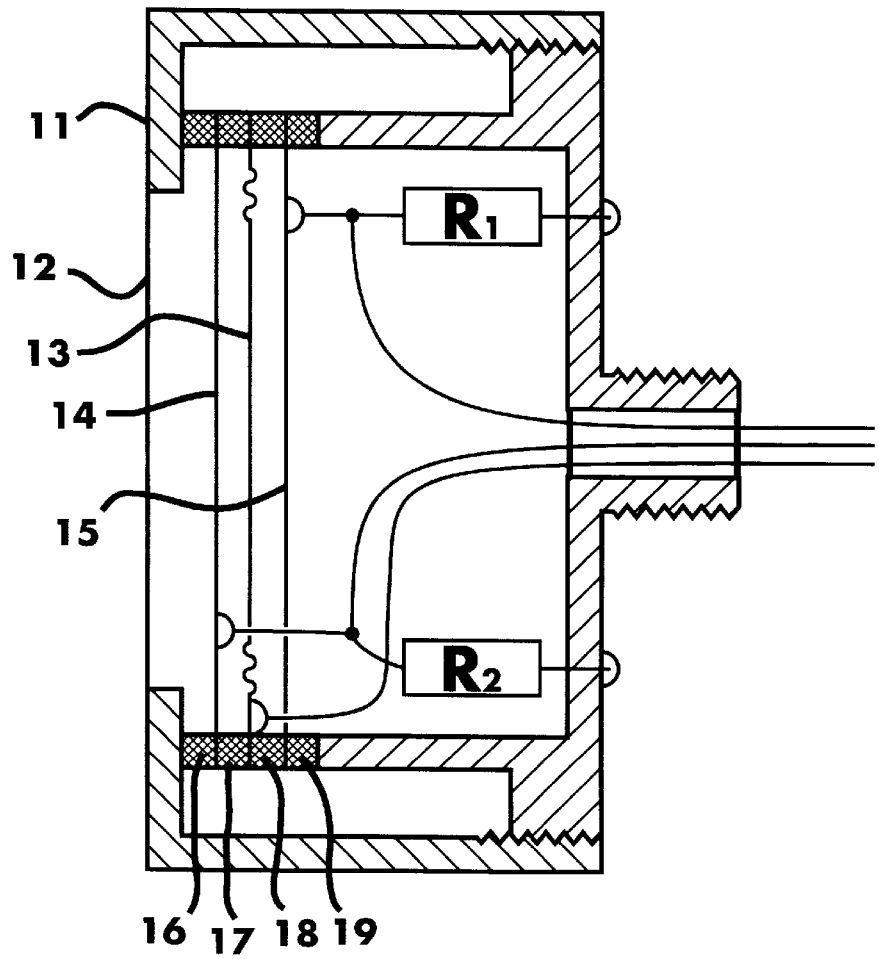
FIG. 2 is a cross-sectional view of a differential phase shift transducer for the amplification of sound waves.
Figure 2:
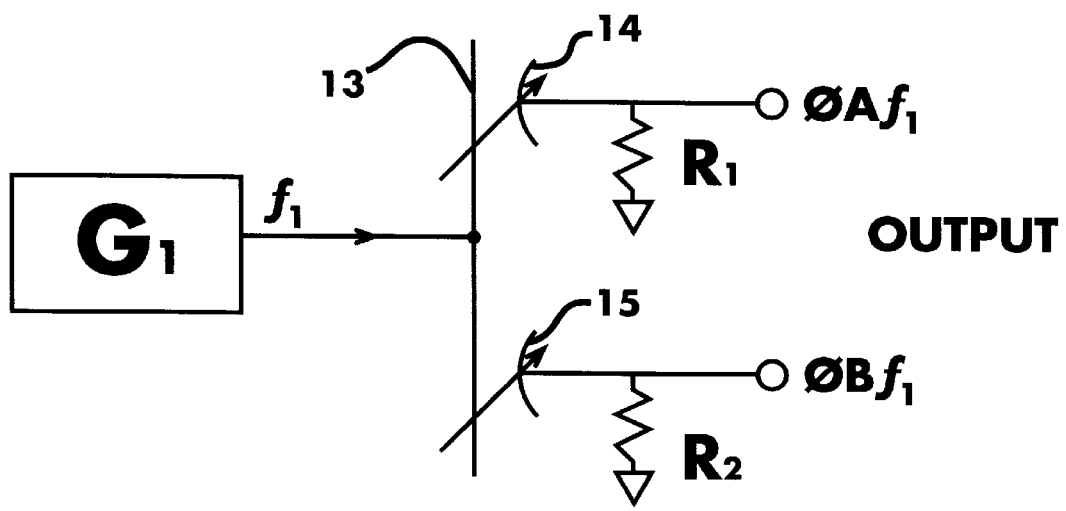
Figure 3:
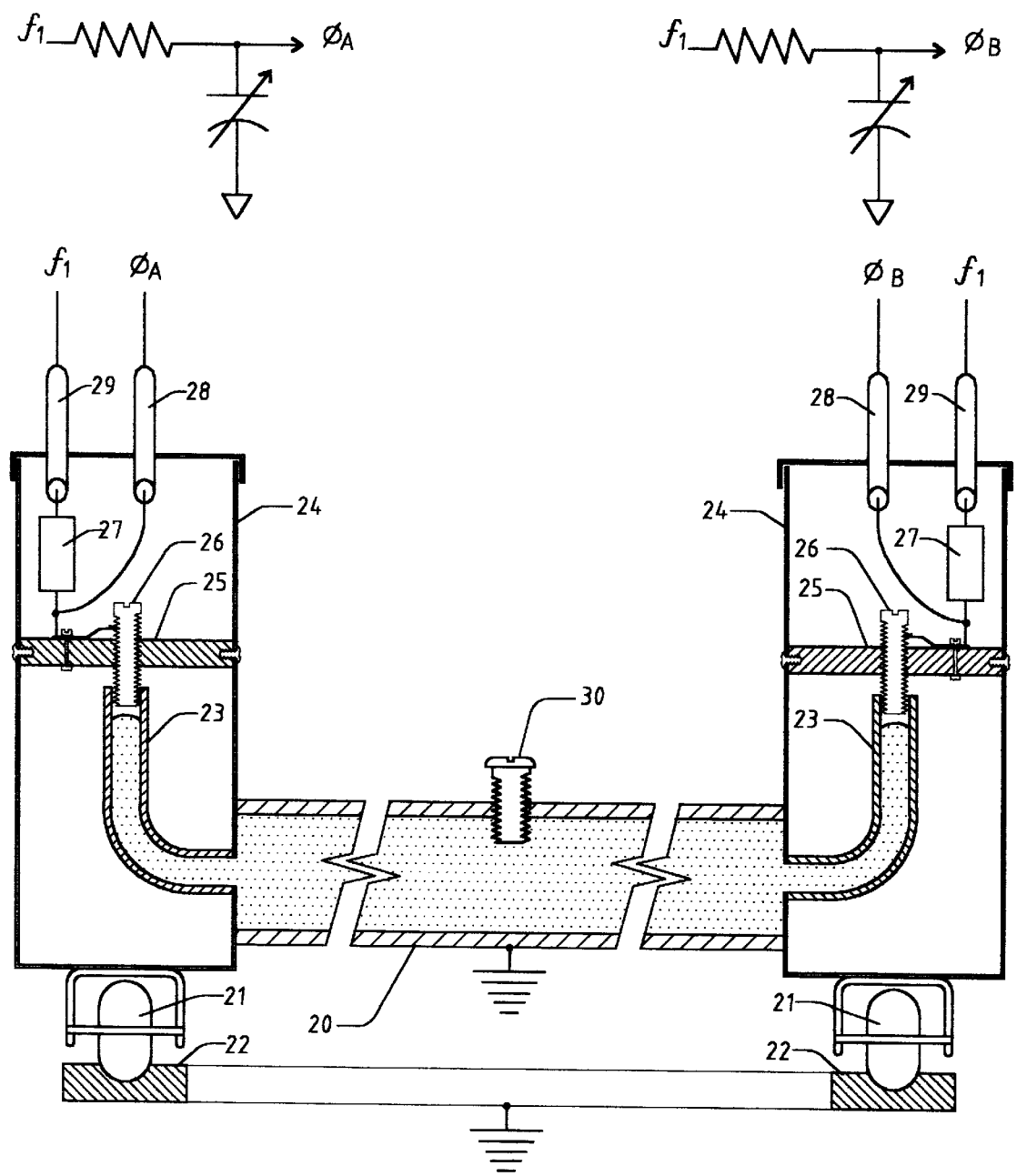
FIG. 3 is a cross-sectional view of a differential phase shift transducer for gravitational field detection of a remote mass.

The drawing of FIG. 2 is a cross-sectional view of a sound transducer with a metal enclosure 11. Sound waves can enter through metal mesh 12. Sound waves can deflect the central diaphragm 13, thus varying its distance differentially from the mesh diaphragms 14 and 15 on each side of it and therefore the differential capacitance between them. The three diaphragms are selected to be of equal flexibility. A shock wave will deflect the three diaphragms equally in one direction thus maintaining the same spacing between them so there is no differential capacity change as there is for a sound wave, thus muting the shock wave. Load resistors $R_1$ and $R_2$ are of equal value and connect to the two metal mesh diaphragms 14 and 15, Insulated wires connect to the external circuit. The grounded outer metal shell provides electrical shielding for the differential sound transducer. Insulating rings 16, 17, 18 and 19 are used to space the diaphragms. The equivalent RC differential phase shift circuit is shown.

FIG. 3 is a cross-sectional drawing of a rotatable gravitational transducer which is sensitive to the presence of a remote mass. A long steel pipe 20 is supported at each end by rollers 21 which can run on a level circular track 22. Each end of the pipe 20 connects to a small vertical tube 23 of insulating material which is inside a metal shield enclosure 24. An insulating plate 25 placed over each vertical tube 23 supports a steel screw 26 which enters the end of the insulating tube 23. Metal springs make contact against the steel screws and are connected to the resistors 27 and coax cable 28. The large long tube 20 is filled with mercury to a level which fills the narrow insulating tubes 23 to near the top. As the mercury is grounded, each screw 26 above the mercury is a capacitor plate which can be adjusted to a desired distance from the top of the mercury column to make equal differential capacitors. The carrier frequency $f_1$ is fed by coax lines 29 through resistor 27 connected to the steel screw capacitor plate 24 which is connected to the output circuit by coax 28. Two RC differential phase shifts circuits are at the ends of the mercury column. When a remote mass is in line with the long pipe, the mercury in the pipe is attracted to it by gravitational force and its level in one insulating tube will go down, reducing capacity to the screw, while the mercury at the other end will go up, increasing the capacity to the screw. The differential change in these capacities results in a differential change in the phase angle of the two outputs. A large screw 30 in the long pipe 20 allows adjustment of the level of the mercury. If the pipe 20 is rotated on its circular track 22 the phase shift in the output circuits due to an external mass will reverse every 180° of rotation. Centrifugal forces on the mercury are equal in each direction of the pipe and therefore cancel out. Directivity and sensitivity are in line with the long mercury filled pipe 20. The ratio of pipe and tube diameters is the hydraulic amplification factor. It can be understood that the physical movement of the mass of mercury in this transducer in response to the gravitational attraction of a remote mass is very small. At very high and ultra high frequencies, very small changes in mechanical dimensions of circuit structures can result in large changes in circuit capacitance and inductance. Therefore, it can be understood that a VHF or UHF carrier frequency and a suitable VHF or UHF circuit structure should be used in the gravitational transducer to achieve great sensitivity. The differential phase angle outputs of the UHF or VHF transducer may be heterodyned in mixers to a frequency low enough to be amplified as described.

Figure 4:
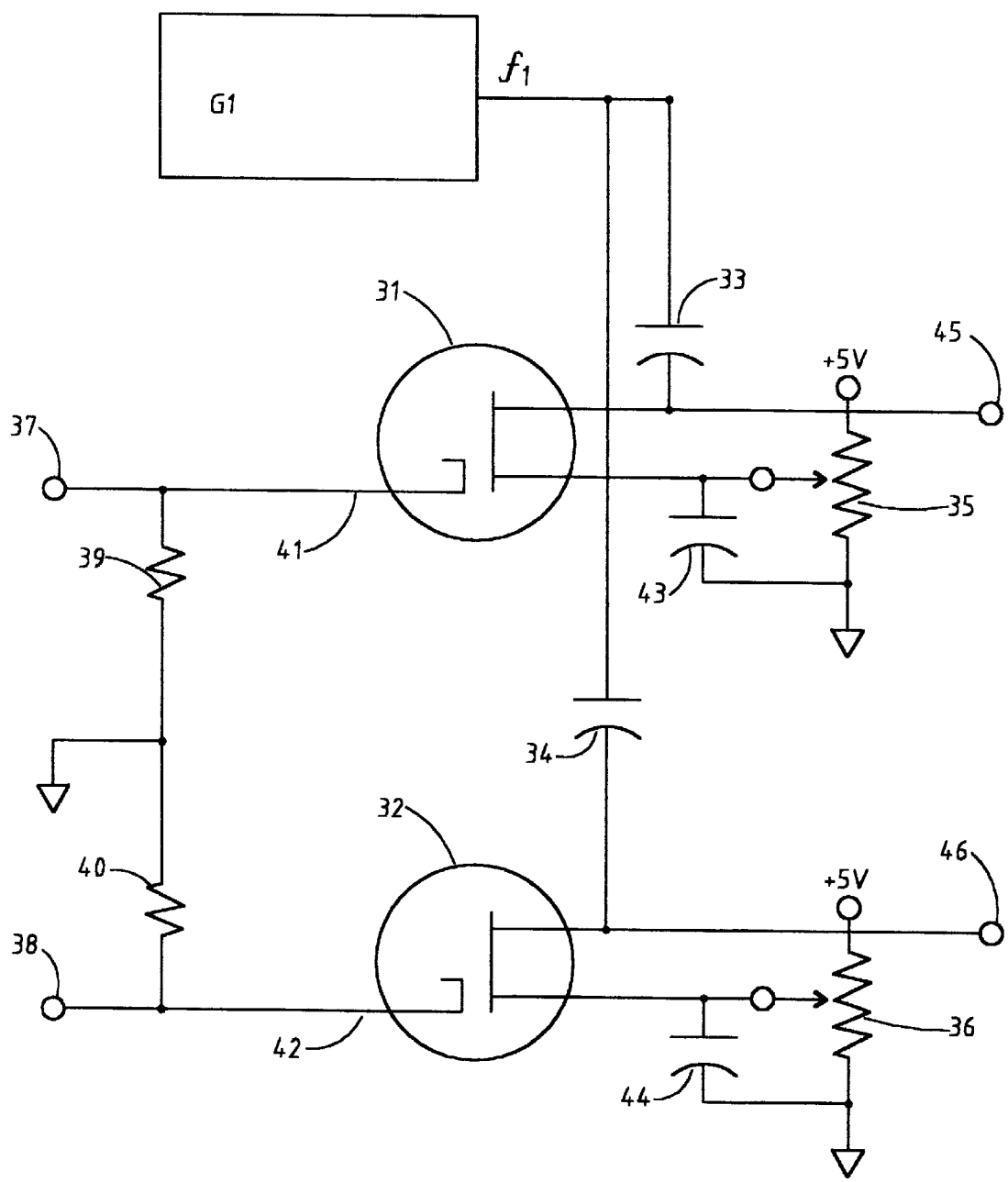
FIG. 4 is a schematic diagram of a differential phase shift transducer for D.C. voltage.

The drawing of FIG. 4 is a schematic diagram of a transducer for electrical voltage.

A carrier generator $G_1$ feeds a one-volt sine wave to the sources of MOSFETS 31 and 32 through equal value capacitors 33 and 34. The drains of the mosfets are biased by voltages from potentiometers 35 and 36 so that the mosfet operates on the steep bottom part of its characteristic curve. Input terminals 37 and 38 are grounded through high resistances 39 and 40 and connect to gates 41 and 42 of the mosfets 31 and 32. Drains of the mosfets are grounded for R.F. by capacitors 43 and 44. The sources of the mosfets are connected to output terminals 45 and 46. The mosfets act as variable resistors when fed a one-volt source voltage and biased as described. An input voltage increases the phase shift at one output terminal and decreases the phase shift at the other output terminal, thus converting voltage input to a differential phase shift at the output terminals 45 and 46.

I claim:

1. A differential phase shift amplifier system comprising:
   a source of a sine wave carrier frequency;
   a source of a square wave beat frequency higher than said carrier frequency;
   a source of a physical or electrical quantity;
   a transducer receiving said carrier frequency and said physical or electrical quantity and using resistive or reactive circuit means to convert said physical or electrical quantity to differential phase angles of said carrier frequency at two outputs;
   two amplifiers receiving said two carrier frequency outputs and having two square wave outputs differing differentially in their phase angle;
   two digital mixers receiving said amplifier outputs and said high beat frequency and having low difference frequency products differing differentially in phase;
   two frequency doubler circuit chains multiplying said low frequency mixer products to the carrier frequency and thus multiplying said phase differential by the chain multiplication factor;
   two chains of digital mixers and frequency doubler circuits further multiplying said differential phase angle of said carrier frequency to a desired value of phase or frequency differential which is an amplified analog equivalent of said physical or electrical quantity.

2. A differential phase shift amplifier system according to claim 1 for amplification of voltage using a transducer which receives said voltage at the gates of two metal on silicon field effect transistors which are biased to operate as two variable resistances in two resistance-capacitance phase shift output circuits having a differential phase shift output caused by said voltage.

3. A differential phase shift amplifier system according to claim 1 for amplification of sound waves using a transducer which receives said sound waves by their vibration of a metal diaphragm movable capacitor plate centrally placed between two metal mesh diaphragm capacitor plates not caused to vibrate which act as two fixed capacitor plates in two resistance capacitance phase shift circuits having a differential phase shift output caused by vibration of said central diaphragm by said sound waves.

4. A differential phase shift amplifier system according to claim 1 using a transducer having a liquid electrically conductive grounded mass for reception of gravitational force by its movement in a column toward an external mass with consequent differential capacity change to metal electrodes placed near the ends of said liquid column and thus causing a differential change in two capacity resistor circuits and a consequent differential phase shift output of said carrier frequency.

5. The method of amplifying a physical or electrical quantity using a differential amplifier system comprising:
   generating a sine wave carrier frequency;
   generating a square wave frequency higher than said carrier frequency;
   applying said physical or electrical quantity to a transducer receiving said carrier frequency;
   converting said physical or electrical quantity to differential phase angles of said carrier frequency at two outputs of said transducer;

amplifying said two outputs to square waves;

applying said two outputs to two digital mixers receiving said high beat frequency;

applying the low difference frequency products of said two mixers to the inputs of two chains of frequency doubler circuits multiplying said low frequencies to the carrier frequency and thus multiplying said differential phase angle by the frequency multiplication factor;

continuing the described process of down conversion and frequency doubling back to the carrier frequency in two circuit chains to further multiply said differential phase angle to a desired value of phase or frequency differential which is an amplified analog of said physical or electrical quantity.

6. A differential amplifier system for amplifying a physical or electrical quantity by multiplying its analog equivalent comprising:

means for generating a sine wave carrier frequency;

means for generating a square wave beat frequency higher than said carrier frequency;

a source of a physical or electrical quantity;

transducer means receiving said carrier frequency and said physical or electrical quantity and converting said quantity to an analog equivalent value of differential phase angles of said carrier frequency at two outputs;

amplifier means receiving said two outputs and having two square wave outputs differing differentially in phase;

digital mixer means receiving said two outputs and said high beat frequency and having difference products of two low frequency square waves differing differentially only in their phase angle;

digital frequency doubling means receiving said low frequency square waves and multiplying said differential phase angle by the frequency doubling multiplication factor while multiplying the low frequency to the carrier frequency;

digital circuit means continuing this process of down conversion and frequency doubling as described to multiply said differential phase angle and thus amplifying the analog value of said physical or electrical quantity.

* * * * *